United States Patent
Jeong et al.

(10) Patent No.: US 6,717,861 B2
(45) Date of Patent: *Apr. 6, 2004

(54) NON-VOLATILE SEMICONDUCTOR MEMORY DEVICE CAPABLE OF PREVENTING PROGRAM DISTURB DUE TO NOISE VOLTAGE INDUCED AT A STRING SELECT LINE AND PROGRAM METHOD THEREOF

(75) Inventors: Jae-Yong Jeong, Kyunggi-do (KR); Sung-Soo Lee, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 2 days.

This patent is subject to a terminal disclaimer.

(21) Appl. No.: 10/006,196

(22) Filed: Dec. 4, 2001

(65) Prior Publication Data

US 2002/0075727 A1 Jun. 20, 2002

(30) Foreign Application Priority Data

Dec. 14, 2000 (KR) ........................................ 2000-76375

(51) Int. Cl.[7] ................................................ G11C 16/04
(52) U.S. Cl. ............................. 365/185.28; 365/185.17; 365/185.25
(58) Field of Search ........................ 365/185.28, 185.17, 365/185.25

(56) References Cited

U.S. PATENT DOCUMENTS

| 5,677,873 A | 10/1997 | Choi et al. |
| 5,715,194 A | 2/1998 | Hu |
| 5,969,990 A * | 10/1999 | Arase .................... 365/185.25 |
| 5,991,202 A | 11/1999 | Derhacobian et al. |
| 6,061,270 A | 5/2000 | Choi |
| 6,163,048 A * | 12/2000 | Hirose et al. ............... 257/315 |
| 6,480,419 B2 * | 11/2002 | Lee ....................... 365/185.18 |

* cited by examiner

*Primary Examiner*—Connie C. Yoha
(74) *Attorney, Agent, or Firm*—Marger Johnson & McCollom, P.C.

(57) ABSTRACT

Disclosed is a non-volatile semiconductor memory device including a circuit for controlling potentials of select lines and word lines in accordance with bit line setup, string select line setup, program and discharge periods of a program cycle. The control circuit biases a string select line to a power supply voltage during the bit line setup period in the program cycle, and to a voltage between the power supply voltage and ground voltage during the string select line setup and the program periods. According to the string select line control scheme, program disturb due to a noise voltage induced at a string select line when a program voltage is applied to a word line adjacent to the string select line is prevented.

29 Claims, 5 Drawing Sheets

US 6,717,861 B2

NON-VOLATILE SEMICONDUCTOR MEMORY DEVICE CAPABLE OF PREVENTING PROGRAM DISTURB DUE TO NOISE VOLTAGE INDUCED AT A STRING SELECT LINE AND PROGRAM METHOD THEREOF

This application relies for priority upon Korean Patent Application No. 2000-076375, filed on Dec. 14, 2000, the contents of which are herein incorporated by reference in their entirety.

FIELD OF THE INVENTION

The present invention generally relates to semiconductor memory devices, and more specifically to a non-volatile semiconductor memory device capable of preventing program disturb due to a noise voltage induced at a string select line and a program method thereof.

BACKGROUND OF THE INVENTION

Demand for semiconductor memory devices capable of electrically erasable and programmable without a refresh function to retain data stored therein is on the rise. Further, attempts for improving the storage capacitance and integration of the memory device are increasing. A non-volatile memory device offers the large-scaled storage capacitance and high integration, without refresh of such a stored data, and one example of the device is a NAND-type flash memory device. Since the NAND-type flash memory device retains the data even in a case of power-off, it is widely used in applications where the possibility of power supply interruption is present such as a portable terminal equipment, a portable computer, and etc.

Conventional non-volatile semiconductor memory devices like the NAND-type flash memory device include a type of electrically erasable and programmable read-only memory (EEPROM) device typically referred to as "a flash EEPROM device". Flash EEPROM devices generally include a semiconductor substrate (or bulk) of a first conductivity type, e.g. P-type; spaced source and drain regions of a second conductivity type, e.g. N-type, in the substrate; a channel region at a face of the substrate, between the spaced source and drain regions; a floating gate for storing charge carriers when the device is programmed; and a control gate which overlies the floating gate, opposite the channel region.

An array in the well-known NAND-type flash memory device is shown in FIG. 1. Referring to FIG. 1, the memory cell array includes a plurality of cell strings 10 corresponding to bit lines. Here, two bit lines BL0 and BL1 and two cell strings 10 corresponding thereto are exemplified in FIG. 1, for the sake of convenience. Each of the cell strings 10 is composed of a string select transistor SST as a first select transistor, a ground select transistor GST as a second select transistor, and a plurality of EEPROM cells MC0 through MC15 being serially connected between the select transistors SST and GST. The string select transistor SST has a drain connected to a corresponding bit line and a gate connected to string select line SSL. The ground select transistor GST has a source connected to a common source line CSL and a gate connected to a ground select line GSL. Between the source of the string select transistor SST and the drain of the ground select transistor GST, the flash EEPROM cells MC15~MC0 are serially connected, which are respectively connected to word lines WL15~WL0 corresponding thereto.

Initially, the flash EEPROM cells in the memory cell array are erased to a certain threshold voltage, e.g. −3V. For the purpose of programming the flash EEPROM cells, a high voltage, e.g. 20V, is applied to a word line of a select memory cell for a predetermined time. Thus, the select memory cell is charged to a higher threshold voltage while the threshold voltages of unselect EEPROM cells remain unchanged.

A problem arises when it is desired to program a selected flash EEPROM cell along a word line without programming unselect memory cells on the same word line. When a program voltage is applied to the word line, the voltage is applied not only to the selected flash EEPROM cell but also to the unselected flash EEPROM cells along the same word line for programming. Thus, the unselected flash EEPROM cell, in particular the flash EEPROM cell adjacent to the selected cell, is programmed. The unintentional programming of an unselected cell connected to a selected word line is referred to herein as "program disturb."

One of the ways for preventing program disturb is a program inhibit method employing a self-boosting scheme. The program inhibit method employing the self-boosting scheme is disclosed in U.S. Pat. No. 5,677,873 entitled "Method of Programming Flash EEPROM Integrated Circuit Memory Devices to Prevent Inadvertent Programming of Nondesignated NAND memory cells therein", and U.S. Pat. No. 5,991,202 entitled "Method for Reducing Program Disturb during Self-Boosting in a NAND flash Memory", which are incorporated herein by reference.

FIG. 2 is a timing diagram showing a programming operation according to the program inhibit method employing the self-boosting scheme. A ground path is blocked by applying 0V to the gate of the ground select transistor GST. A zero voltage (0V) potential is applied to a selected bit line, e.g., BL0, and a power supply voltage Vcc as the program inhibit voltage such as 3.3 V or 5V is applied to an unselected bit line, e.g., BL1. At the same time, the power supply voltage Vcc is applied to the gate of the string select transistor SST connected to the bit line BL1, which causes the source of the string select transistor SST (or the channel of a program inhibited cell transistor) to be charged up to Vcc-Vth (Vth is a threshold voltage of the string select transistor). Here, the string select transistor SST is substantially blocked or shut off. A time period for the aforementioned operation is referred to "a bit line setup period".

Next, the channel voltage Vchannel of the program inhibited cell transistor is boosted by applying a high voltage, e.g. a program voltage Vpgm, to the selected word line, and applying a lower, e.g. a pass voltage Vpass, to the unselected word lines. Thus, Fowler-Nordheim (F-N) tunneling is prevented between a floating gate and the channel region. This retains the initial erased state of the program inhibited cell transistor. A time period for such an operation is referred to "a program period". After programming for the select memory cell is complete, a recovery operation for discharging charges of the bit line is performed.

The program inhibit method employing the self-boosting scheme has a problem when applied to the flash memory device. Typically, the interval between adjacent signal lines decreases in accordance with the increasing integration of the device, so that coupling between the lines readily occurs due to parasitic capacitance between adjacent signal lines. To program a memory cell, e.g. MC15, adjacent the string select transistor SST, when the program voltage Vpgm is applied to a select word line WL15 connected to the memory cell MC 15, a nominal voltage of the string select line SSL is boosted higher than the power supply voltage Vcc due to the coupling with the select word line WL15. This is shown in FIG. 2. The voltage rise of the string select line SSL causes the charges produced by the self-boosting operation in the channel of the program inhibit cell transistor to go out to the unselected bit line. In other words, as shown in FIG. 2, the channel voltage Vchannel of the program inhibited cell transistor (or an inhibit voltage Vinhibit) is lowered by ΔV in proportion to the voltage rise of the string select line SSL. Thus, a program disturb where the program inhibited cell transistor is programmed undesirably occurs.

SUMMARY OF THE INVENTION

It is, therefore, an object of the present invention to provide a non-volatile semiconductor memory device capable of preventing program disturb that might otherwise occur while programming a memory cell adjacent to a string select line, and a program method thereof.

In order to attain the above objects, according to an aspect of the present invention, there is provided a method of programming in a non-volatile semiconductor memory device. The memory device includes a memory cell array formed of a plurality of cell strings each of which is connected through a first and second select transistors between a bit line and a common source line and has a plurality of memory cell transistors, formed in a pocket P-well, having control gates of the memory cell transistor being respectively coupled to word line arranged in parallel between a first and second select lines. For the purpose of programming in the non-volatile semiconductor memory device, in a state that the first select line is biased to a first voltage, one of the first voltage and a second voltage is respectively applied to the bit lines corresponding to cell strings in accordance with data bits to be programmed. Here, the second voltage is lower than the first voltage. Next, the first select line is biased to a third voltage between the first and second voltages. Afterwards, program voltage is applied to a select word line of the word lines.

The first voltage is a power supply voltage, and the second voltage is a ground voltage. The third voltage is enough to turn off the first select transistor connected to the bit line corresponding to the data being programmed.

The third voltage is enough to turn off the first select transistor connected to the bit line corresponding to the data bit being programmed.

The third voltage is between a fourth and fifth voltage. The fourth voltage is enough to turn on the first select transistor connected to the bit line corresponding to the data bit being programmed, and the fifth voltage is a shut-off voltage on the basis of the bit line corresponding to the data bit being program inhibited. The shut-off voltage is given by the first voltage—(β×Vpgm); where β is a coupling ratio of word line to string select line, and Vpgm is the program voltage.

According to another aspect of this invention, there is provided a non-volatile semiconductor memory device having a memory cell array as one memory block. The memory cell array is formed of a string select transistor whose drain is connected to a bit line corresponding thereto, a ground select transistor whose source is connected to a common source line, a plurality of cell strings having a plurality of memory cell transistors serially connected between a source of the string select transistor and a drain of the ground select transistor, word lines respectively connected to control gates of the memory cell transistors, string select line commonly connected to gates of the string select transistors, and a ground select line commonly connected to gates of the ground select transistors. The non-volatile semiconductor memory device further includes control means and a page buffer circuit. The control means separately controls potentials of the select lines and word lines according to a bit line setup period, a string select line setup period, a program period, and a discharge period of the program cycle. The page buffer circuit respectively applies one of the first and second voltages to the bit lines in accordance with data bits to be programmed in the memory cell array, during the bit line setup period of the program cycle. The control means biases the string select line to the first voltage during the bit line setup period, and to a third voltage between the first and second voltages during the string select line setup and program periods.

As is apparent from the foregoing, according to the device and method of the invention, program disturb due to a noise voltage induced at the string select line can be prevented, when the program voltage is applied to a word line adjacent to the string select line.

The foregoing features and advantages of the invention will be more fully described in the accompanying drawings.

BRIEF DESCRIPTION OF THE DRAWINGS

The above and other objects, features and advantages of the present invention will become more apparent from the following detailed description when taken in conjunction with the accompanying drawings in which.

DESCRIPTION OF THE PREFERRED EMBODIMENT

In the following description for purposes of explanation, specific numbers, materials and configurations are set forth in order to provide a thorough understanding of the present invention. However, it will be apparent to one skilled in the art that the present invention may be practiced without the specific without the specific details. In other instances, well-known systems are shown in diagrammatic or block diagram form in order not to obscure the present invention.

A program cycle in a NAND-type flash memory device of the present invention includes a bit line setup, a string select line setup, a program, and a discharge period. The program cycle is iteratively performed a number of predetermined times, which is well-known to those skilled in the art. In the NAND-type flash memory device of the present invention, after the bit line setup period that bit lines are charged up to either power supply voltage or ground voltage according to data bits loaded in page buffers, a potential of string select line is set up lower than the potential established in the bit line setup period prior to the program period. Owing to the additional string select line setup period, the program disturb generated when a program voltage is applied to a word line adjacent to the string select line can be prevented, which is in detail described hereinafter.

Figure 1:
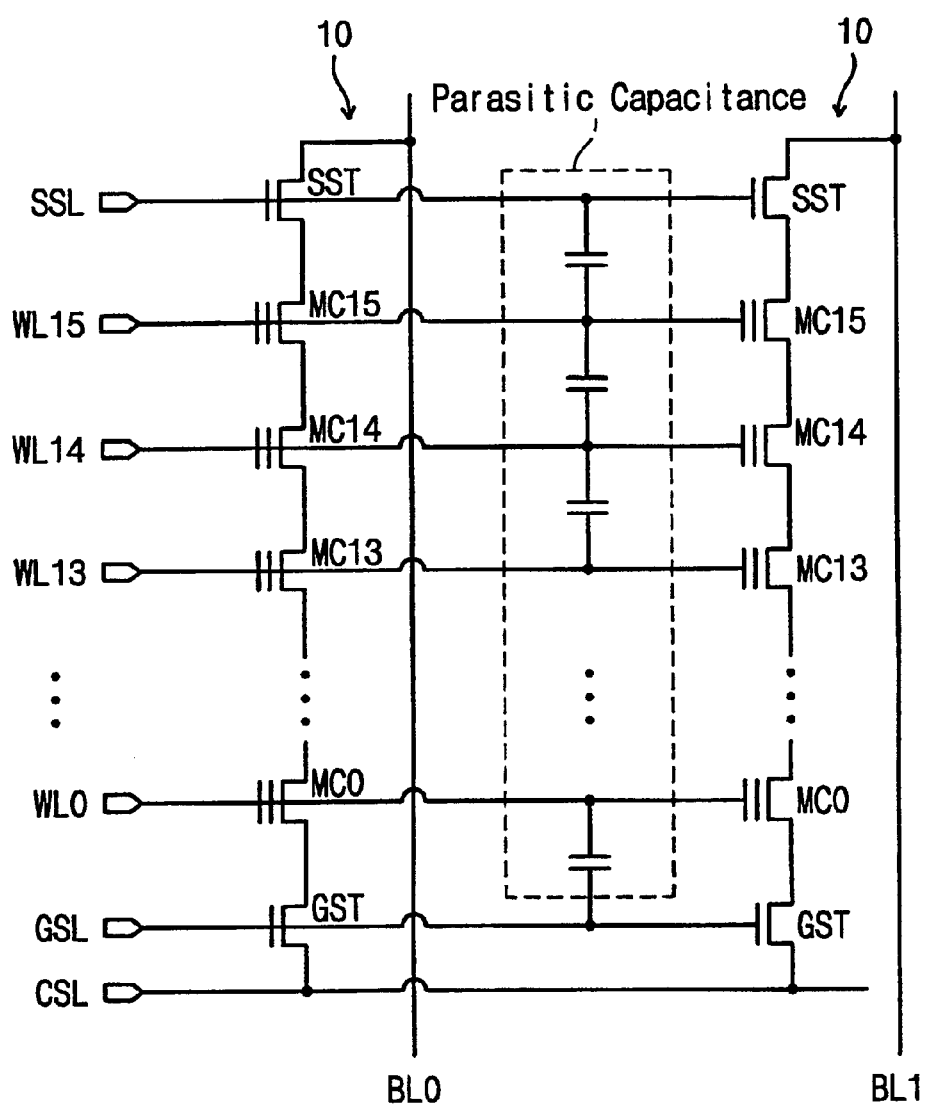
FIG. 1 is a circuit diagram showing a configuration of an array in a general flash memory device.
Figure 2:
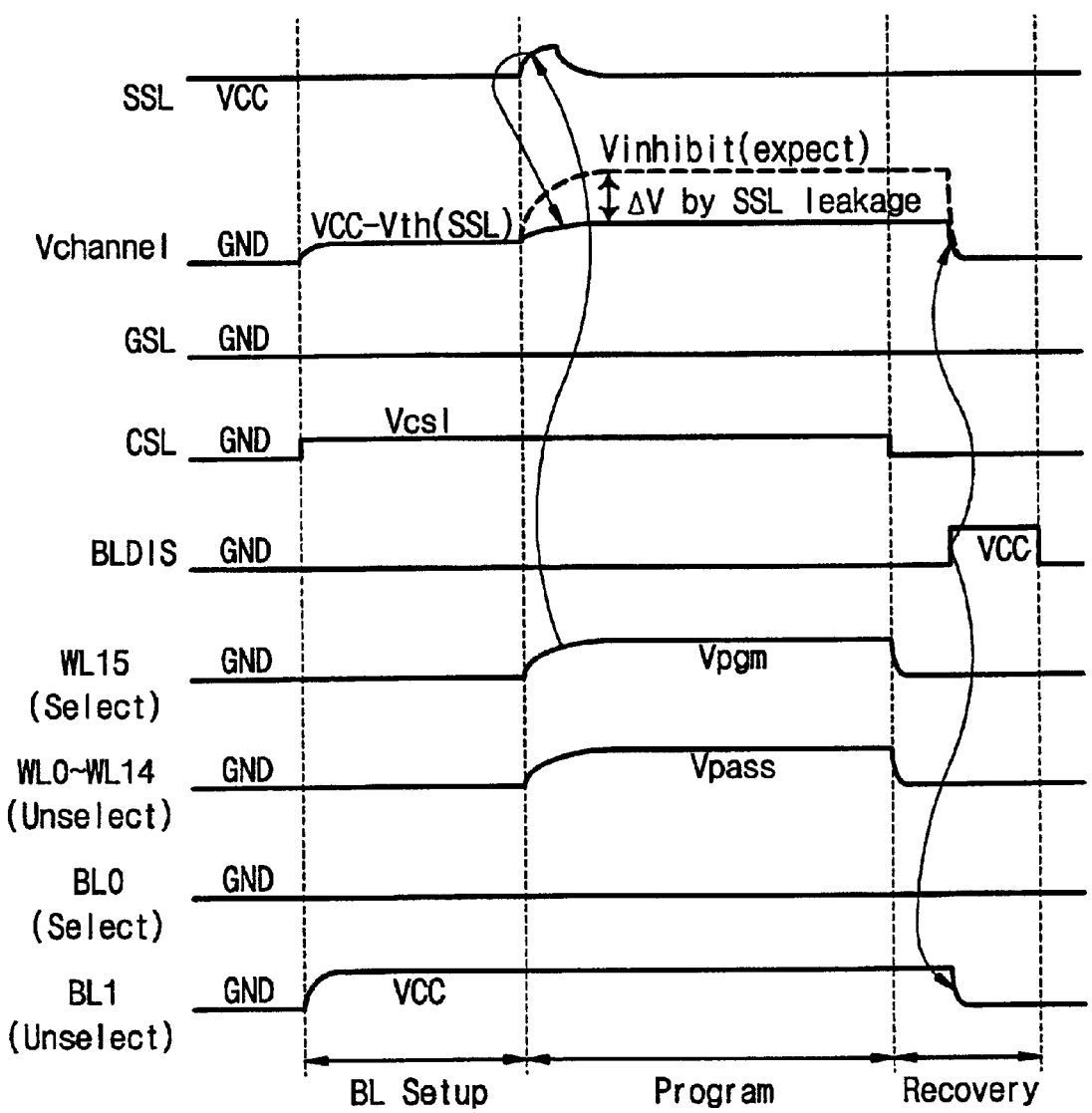
FIG. 2 is a timing diagram showing a programming operation according to the conventional art.
Figure 3:
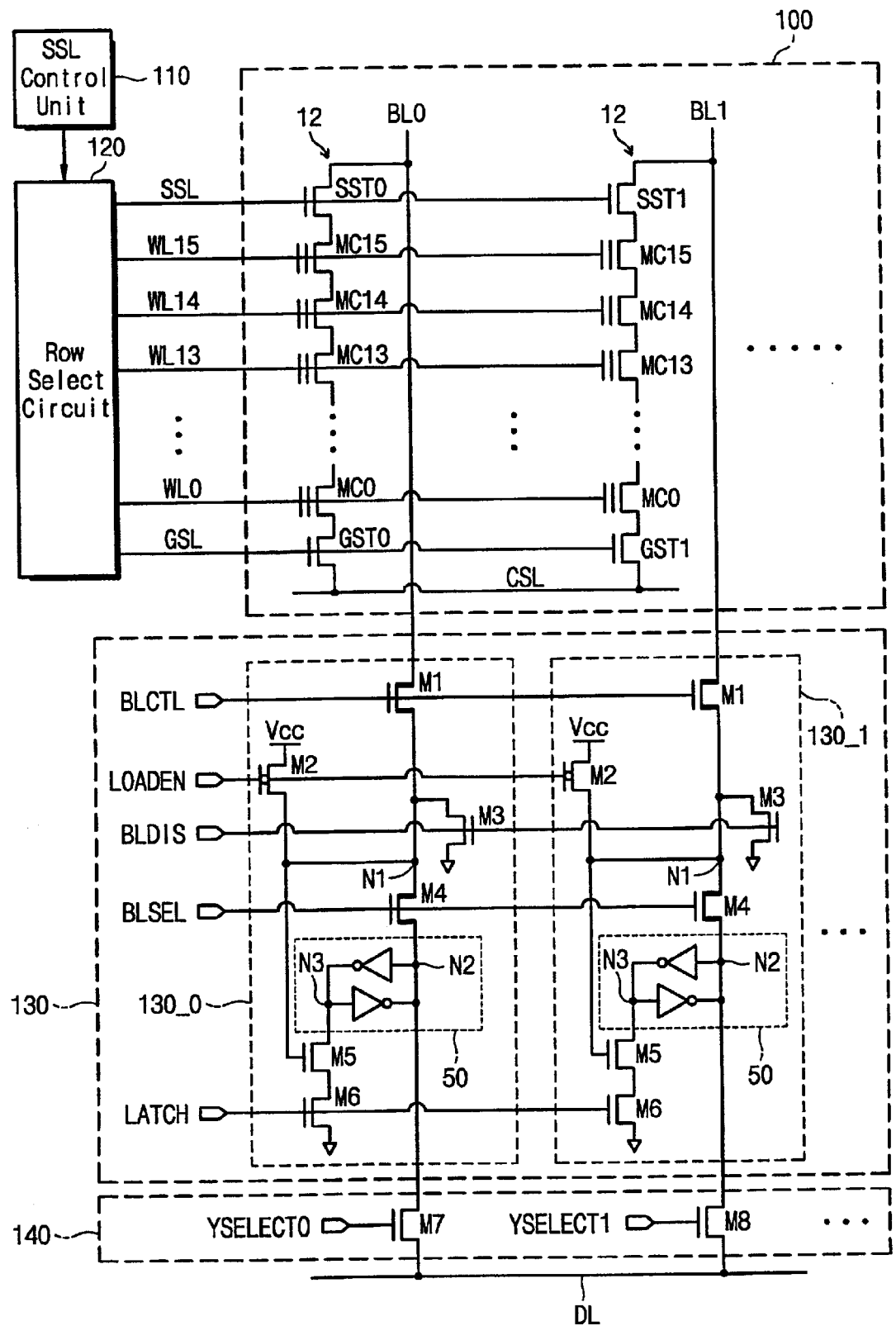
FIG. 3 is a block diagram showing a flash memory device according to a preferred embodiment of the present invention.

FIG. 3 shows the NAND-type flash memory device according to a preferred embodiment of the invention.

Referring first to FIG. 3, the memory device includes a cell array 100, a row select circuit 120, a page buffer circuit 130, and a column pass gate circuit 140. The cell array 100 is formed of a plurality of cell strings (or NAND strings) 12. Each of the cell strings 12 has a string select transistor SSTm (m=0, 1, 2, ..., i) whose gate is coupled to string select line SSL. Each of the cell strings 12 further includes a ground select transistor GSTm whose gate is coupled to ground select line GSL. The plurality of memory cells or flash EEPROM cells MCn (n=0, 1, 2, ..., 15) are serially connected between a source of the string select transistor SSTm and a drain of the ground select transistor GSTm. Control gates of the EEPROM cells MCn are respectively connected to word lines WLj corresponding thereto. The drain of the respective string select transistor is connected to the bit line BLm, and the source of the respective ground select transistor GSTm is connected to common source line CSL. The string select line SSL, word lines WLj, and ground select line GSL are electrically connected to the row select circuit 120.

Figure 4:
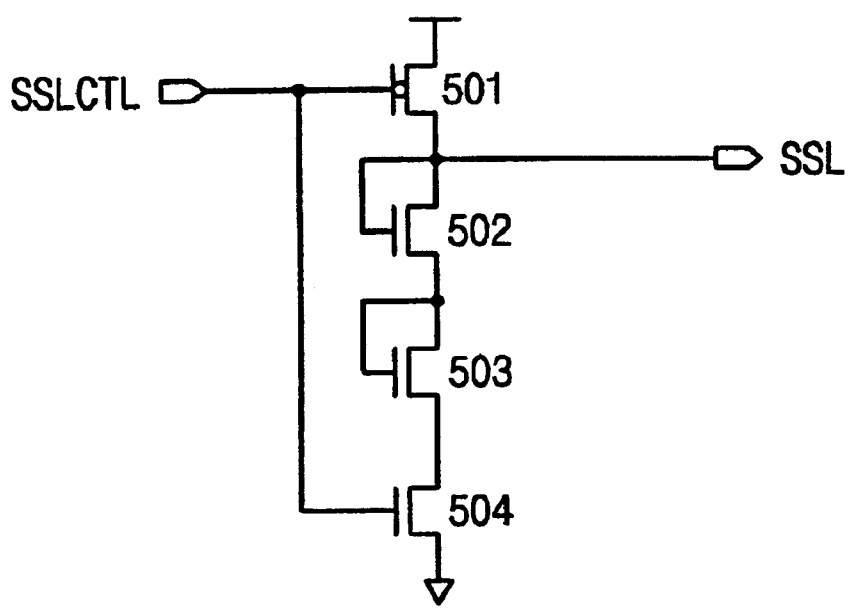
FIG. 4 is a string select line control unit shown in FIG. 1.

The row select circuit 120 controls potentials of the select lines and the word lines in accordance with a bit line setup period, a string select line setup period, a program period, and a discharge period of the program cycle. In the memory device, a string select line control unit 110 is further provided, which controls the string select line SSL through the row select circuit 120 in order to have voltage levels depending on the bit line setup, string select line setup, and program periods of the program cycle. Referring to FIG. 4 showing the string select line control unit 110, one P-channel metal oxide semiconductor (PMOS) transistor 501 and three N-channel MOS transistors 502, 503 and 504 compose the string select line control unit 110. The PMOS transistor 501 is connected between the power supply voltage and an input signal SSLCTL, and the NMOS transistors 502, 503, and 504 are serially connected between the string select line SSL and the ground voltage. The input signal SSLCTL maintains at a low level of the ground voltage GND during the bit line setup period in the program cycle. Thus, the PMOS transistor 501 is turned on, and then the string select line SSL is at a high level of the power supply voltage Vcc. The input signal SSLCTL is at the high level of the power supply voltage Vcc during the string select line setup and program periods of the program cycle. Thus, the NMOS transistor 504 is turned on, and then the string select line SSL has a voltage level Vss1 corresponding to the sum of the threshold voltages of the diode-coupled NMOS transistors 502 and 503, i.e. 2 Vth.

Here, the two diode-coupled NMOS transistors 502 and 503 are connected between the string select line SSL and the NMOS transistor 504. However, it is possible that not only one diode-coupled but also three or more diode-coupled NMOS transistors may be so connected, within the spirit and scope of the invention.

Referring again to FIG. 3, the page buffer circuit 130 includes page buffers 130_i corresponding to the bit lines BLi. During a read cycle, the page buffer senses data from a select cell and transfers the same to a data output buffer (not shown) through the column pass gate circuit 140. During the program cycle, the page buffer temporarily stores the data applied from the input/output buffer through the column pass gate circuit 140. The architecture and function of the page buffer 130_0 corresponding to the bit line BL0 will be exemplarily described hereinafter. The other page buffers 130_1~130_i corresponding to the other bit lines BL1~BLi have the same function and architecture of the page buffer 130_0.

The page buffer 130_0 includes a PMOS transistor M2, five NMOS transistors M1 and M3~M6, and a latch 50 formed of two cross-coupled inverters. The NMOS transistor M1 has a current path connected between the bit line BL0 and a node N1, and a gate coupled to a bit line level control signal BLCTL. The PMOS transistor M2 has a drain connected to a node N1, a gate coupled to load enable signal LOADEN, and a source connected to the power supply voltage Vcc. The NMOS transistor M3 whose source and gate are respectively connected to ground voltage GND and bit line discharge signal BLDIS is connected between the node N1 and the ground voltage GND, which discharges a voltage of the bit line BL0, and initializes the page buffer (or latch) to the ground voltage level. The NMOS transistor M4 whose gate is connected to bit line select signal BLSEL is connected between the node N1 and a second node N2 of the latch 50. A third node N3 of the latch 50 is connected to the ground voltage GND through the NMOS transistors M5 and M6. A gate of the NMOS transistor M5 is connected to the first node N1, and a gate of the NMOS transistor M6 is connected to a latch signal LATCH. The NMOS transistors M5 and M6 change a data status stored in the latch 50 in response to a voltage level on the bit line BL0 and the latch signal LATCH.

Figure 5:
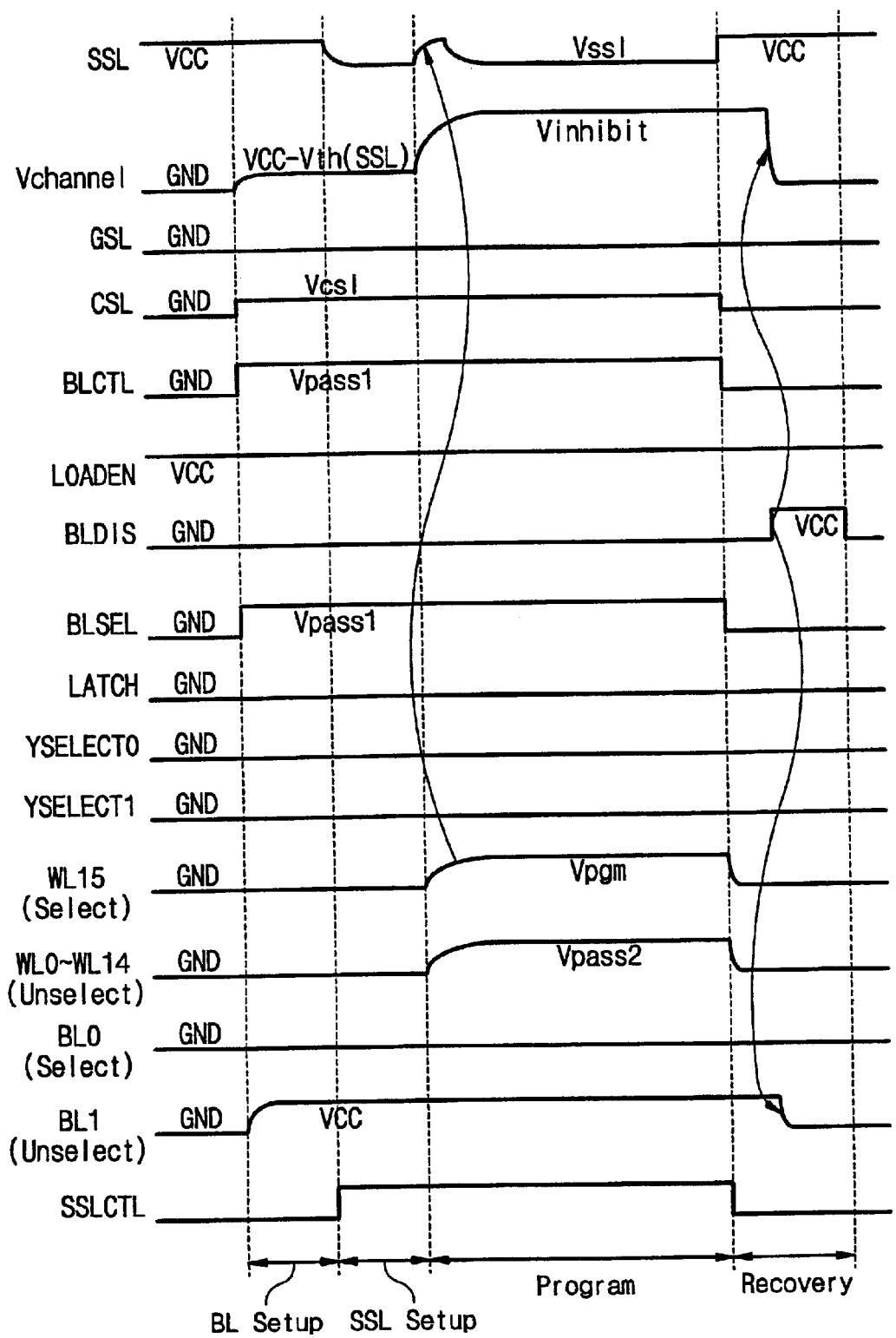
FIG. 5 is a timing diagram showing a programming operation according to a preferred embodiment of the present invention.

FIG. 5 is a timing diagram of a programming operation of the NAND-type flash memory device in the present invention. The programming operation for the NAND-type flash memory device will be explained in detail, with reference to FIGS. 3 through 5. As described above, the program cycle of the present invention consists of the bit line setup, string select line setup, program, and discharge periods, and the cycle is iteratively performed a number of predetermined times. Here, the programming operation employing two bit lines BL0 and BL1 is exemplarily described.

It is assumed that data bits "0" and "1" to be programmed are respectively loaded in the page buffers 130_0 and 130_1 corresponding to the bit lines BL0 and BL1. The bit line BL0 corresponding to the page buffer 130_0 that latches the data bit "0" for programming is called a select bit line, while the other bit line BL1 corresponding to the page buffer 130_1 that latches the data bit "1" for program inhibiting is called an unselect bit line. Further, the word line WL15 connected to the EEPROM cell to be programmed, e.g. MC15, receives the program voltage Vpgm during the program period of the program cycle, and it is called a select word line. The rest of the word lines WL0~WL14 receive pass voltage Vpass2 during the program period of the program cycle, and it is called an unselect word line.

As shown in FIG. 5, the string select signal SSL has high level of the power supply voltage VCC, and the bit line select signal BLSEL and the bit line level control signal BLCTL transition to high level of Vpass1 during the bit line setup period. At the same time, signal lines GSL, BLDIS, and LATCH retain at a low level of the ground voltage GND. At that time, the common source line CSL has a predetermined voltage level to prevent a punch-through of the ground select transistor GSTm. Here, the voltage Vpass1 is lower than the pass voltage Vpass2 applied to the unselect word line in the program period, and enough to turn on the programmed cell. According to such bias condition, the NMOS transistor M1 is turned on in response to the bit line level control signal BLCTL having the voltage Vpass1, and the string select transistors SST0 and SST1 of the cell string 12 are turned on in response to the string select signal SSL having high level of the power supply voltage. In addition, the NMOS transistor M4 in the page buffers 130_0 and 130_1 is turned on in response to the bit line select signal BLSEL having high level of the voltage Vpass1.

As a result, during the bit line setup period, the select bit line BL0 reaches the ground voltage, and the unselect bit line BL1 reaches the power supply voltage. Here, the cell string 12 corresponding to the unselect bit line BL1 floats, since the string select transistor SST1 connected to the unselect bit line BL1 is substantially shut off.

Next, the control signal SSLCTL transitions from low level to high level at an initial stage in the string select line setup period, as shown in FIG. 5. Hence, the voltage of the string select line SSL is set up to Vss1 corresponding to the sum of the threshold voltages of the diode-couled NMOS transistors 502 and 503. Briefly, the string select line SSL is biased to a voltage Vss1 that is lower than the power supply voltage Vcc. The voltage Vss1 is summarized thus:

$$Vth < Vss1 < Vshutoff$$

wherein, Vth is a turn-on voltage (or, threshold voltage) of the string select transistor for the selected bit line, and Vshutoff is a shut-off voltage of the string select transistor for the unselected bit line. For instance, when the power supply voltage is applied to the unselected bit line, the voltage Vshutoff is Vcc—($\beta \times$Vpgm). Here, $\beta$ is a coupling ratio of the word line to the string select line. In other words, it is preferable that a voltage lower than a difference between the power supply voltage and a coupling noise voltage is applied to the string select line SSL, with regard to a voltage induced through parasitic capacitance at the string select line (referred to "coupling noise voltage" hereinafter), when the program voltage Vpgm is applied to the word line WL15 adjacent to the string select line SSL. The voltage Vshutoff is two times the threshold voltage of the NMOS transistor, but it is understood to be varied in accordance with the power supply voltage and the coupling noise voltage.

When the main programming operation starts, the program voltage Vpgm is applied to the select word line WL15, and the pass voltage Vpass2 is applied to the unselect word line WL0~WL14. Since the cell string 12 corresponding to the unselect bit line BL1 is floated, as described above, a channel voltage of the EEPROM cell MC15 defined by the unselect bit line BL1 and the select word line WL15, i.e. the program inhibited cell is boosted to a voltage Vinhibit sufficient to prevent the F-N tunneling according to the self-boosting mechanism. At that time, the voltage of the string select line SSL is instantly increased by the amount of coupling noise present, due to the program voltage Vpgm applied to the select word line WL15, as shown in FIG. 5. However, the string select transistor SST2 is not turned on, because the string select line SSL is biased to the voltage Vss1 which is previously defined. Thus, the increased channel voltage Vinhibit of the program inhibited cell transistor in accordance with the self-boosting scheme is retained without loss. After the programming is over, the potential of the bit lines BL0 and BL1 is discharged and the page buffers 130_0 and 130_1 are initialized during the discharge period.

As the foregoing description, the voltage of the string select line SSL is increased higher than the power supply voltage due to the coupling of the string select line SSL to the word line WL15 (or the parasitic capacitance between the string select line SSL and word line WL15) when the program voltage Vpgm is applied to the word line WL15 adjacent to the string select line SSL. For the purpose of preventing this phenomenon, the bit lines are set up to have the voltages corresponding to the data bits, and then the string select line SSL is biased lower than the power supply voltage with reference to the coupling noise due to the parasitic capacitance and the program voltage. Thus, the string select transistor retains the off state, though the coupling noise voltage is induced at the string select line SSL at an initial stage of the program period. As a result, it can prevent the program disturb from occurring in the program inhibited flash EEPROM cell when programming the flash EEPROM cell in a word line or a page adjacent to the string select line.

It is possible to adjust a local self-boosting scheme instead of the self-boosting scheme in the NAND-type flash memory device of the invention. The local self-boosting scheme is another program inhibit method to prevent the program disturb, which is disclosed in U.S. Pat. No. 5,715,194 entitled "Bias Scheme of Program Inhibit for Random Programming in a NAND Flash Memory", and U.S. Pat. No. 6,061,270 entitled "Method for Programming a Non-volatile Memory Device with Program Disturb Control" which are herein incorporated by reference.

In the program inhibit method employing the local self-boosting scheme, the pass voltage is applied to the unselect word line, and then the ground voltage is applied to the unselect word line adjacent to the select word line in a direction of the string select transistor before the program voltage is applied to the select word line. Otherwise, after the pass voltage is applied to the unselect word line, the ground voltage is applied to the two unselected word lines adjacent to the selected word line prior to applying the program voltage to the selected word line. According to another biasing method, the self-boosting operation is performed by applying the voltage Vpass1 to all the word lines, and then synchronously applying the program voltage and the voltage Vpass2 to the selected and unselected bit lines, respectively. Or, the self-boosting operation may be performed by applying a first pass voltage to all the word lines, the voltage Vpass2 to the unselected word line, and the ground voltage to the unselected word line adjacent to the selected word line in a direction of a second select transistor before applying the program voltage to the selected word line. Or, the self-boosting operation may be performed by applying the voltage Vpass1 to all the word lines, the voltage Vpass2 to the unselected word line, and the ground voltage to the two unselected word lines adjacent to the selected word line before applying the program voltage to the selected word line.

Though the local self-boosting scheme also has the program disturb on the program inhibited cell when the cell connected to the word line adjacent to the string select line SSL is programmed, it can be prevented by the programming method of the present invention.

Thus, program disturb due to a coupling noise voltage induced at a string select line when the program voltage is applied to the word line adjacent to the string select line SSL is prevented.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method of programming in a non-volatile semiconductor memory device having a memory cell array formed of a plurality of cell strings each of which is connected through a first and second select transistor between a bit line and a common source line and each of which includes a plurality of cell transistors, formed in a pocket P-well, control gates of each memory cell transistor being respectively coupled to a word line arranged in parallel between a first and second select line, the method comprising the steps of:

during a bit line setup operation, applying one of a first and a second voltage to the bit lines corresponding to the cell strings in accordance with data bits to be programmed, the second voltage being lower than the first voltage, and biasing the first select line to the first voltage;

during a string select line setup operation after the bit line setup operation, biasing the first select line to a third voltage between the first voltage and the second voltage; and during a programming operation after the string select line setup operation, applying a program voltage to a selected one of the word lines.

2. The method of claim 1, wherein the first voltage is a power supply voltage and the second voltage is a ground voltage.

3. The method of claim 1, wherein the third voltage is sufficient to turn on the first select transistor connected to the bit line corresponding to a data bit to be programmed.

4. The method of claim 1, wherein the third voltage is between a fourth and fifth voltage, wherein the fourth voltage is sufficient to turn on the first select transistor connected to the bit line corresponding to the data bit to be programmed, and the fifth voltage is a shut-off voltage of the first select transistor for the bit line corresponding to the data bit to be program inhibited, the shut-off voltage being determined by the first voltage—($\beta \times V_{pgm}$), wherein $\beta$ is a coupling ratio of the word line to the string select line, and wherein $V_{pgm}$ is the program voltage.

5. The method of claim 1, wherein the third voltage is a voltage corresponding to a threshold voltage of a N-channel metal oxide semiconductor (NMOS) transistor or to a sum of the threshold voltages of plural NMOS transistors.

6. The method of claim 1, wherein the bit line setup operation is long enough to raise the bit line corresponding to a data bit to be programmed to the first voltage.

7. The method of claim 1, wherein the string select line setup operation occurs in an interval between completion of the bit line setup operation and completion of a program operation.

8. The method of claim 1, wherein the bit line corresponding to the data bit to be program inhibited is electrically isolated from the cell string corresponding thereto after the bit line setup operation, and a channel voltage of a memory cell transistor, connected to a select word line, corresponding to the data bit to be program inhibited is self-boosted higher than the first voltage when the program voltage is applied to the select word line.

9. The method of claim 8, wherein the self-boosting operation includes a local self-boosting operation.

10. The method of claim 9, wherein the self-boosting operation is achieved by applying a pass voltage to the unselect word line and by applying the ground voltage to the unselect word line adjacent to the select word line before applying the program voltage to the select word line.

11. The method of claim 9, wherein the self-boosting operation is achieved by applying a pass voltage to the unselect word line and by applying the ground voltage to the two unselect word lines adjacent to the select word line before applying the program voltage to the select word line.

12. The method of claim 9, wherein the self-boosting operation is achieved by applying a first pass voltage to all the word lines and by concurrently applying the program voltage and a second pass voltage to the select and unselect bit lines, wherein the first pass voltage is lower than the second pass voltage.

13. The method of claim 9, wherein the self-boosting operation is achieved by applying a first pass voltage to all the word lines, by applying a second pass voltage higher than the first pass voltage to the unselect word line, and by applying the ground voltage to the unselect word line adjacent to the select word line before applying the program voltage to the select word line.

14. The method of claim 9, wherein the self-boosting operation is performed by applying a first pass voltage to all the word lines, by applying a second pass voltage higher than the first pass voltage to the unselect word line, and by applying the ground voltage to the two unselect word lines adjacent to the select word line before applying the program voltage to the select word line.

15. The method of claim 1, wherein the bit line corresponding to the data bit to be program inhibited is electrically isolated from the cell string corresponding thereto after the bit line setup operation, and wherein a pass voltage lower than the program voltage is applied to the unselect word lines for a channel voltage of memory cell transistors of the cell string corresponding to the program inhibit data bit to be self-boosted when the program voltage is applied to the select word line.

16. A method of programming in a non-volatile semiconductor memory device having a memory cell array formed of a plurality of cell strings each of which is connected through a first and second select transistors between a bit line and a common source line and has a plurality of cell transistors, formed in a pocket P-well, having control gates of the memory cell transistor being respectively coupled to a word line arranged in parallel between a first and second select line, method comprising the steps of:

applying one of a first and second voltage, the second voltage being lower than the first voltage, to the bit lines corresponding to the cell strings in accordance with the data bits to be programmed, in such manner that the first select line is biased to the first voltage;

biasing the first select line to a third voltage that is between the first voltage and the second voltage; and applying a program voltage to a selected one of the word lines, in such manner that the first select line is biased to the third voltage.

17. The method of claim 16, wherein the first voltage is a power supply voltage, and the second voltage is a ground voltage.

18. The method of claim 16, wherein the third voltage is sufficient to turn on the first select transistor connected to the bit line corresponding to the data bit to be programmed.

19. The method of claim of 16, wherein the third voltage is between a fourth and fifth voltage, wherein the fourth voltage is sufficient to turn on the first select transistor connected to the bit line corresponding to the data bit to be programmed, and wherein the fifth voltage is a shut-off voltage of the first select transistor for the bit line corresponding to the data bit to be program inhibited, the shut-off voltage being determined by the first voltage—($\beta \times V_{pgm}$), wherein $\beta$ is a coupling ratio of the word line to the string select line, and wherein $V_{pgm}$ is the program voltage.

20. The method of claim 16, wherein the third voltage is a voltage corresponding to a sum of threshold voltages of one or more NMOS transistors.

21. A non-volatile semiconductor memory device comprising:

a memory cell array having a plurality of cell strings formed of a string select transistor having a drain connected to a bit line corresponding thereto, a ground select transistor having a source connected to a common source line, and a plurality of memory cell transistors serially connected between a source of the string select transistor and a drain of the ground select transistor, word lines connected to control gates of the memory cell transistors in the respective cell string, a string select line commonly connected to gates of the string select transistors in the respective cell string, and a ground select line commonly connected to gates of the ground select transistors in the respective cell string;

a means for controlling potentials of the select lines and the word lines in accordance with a bit line setup period, string select line setup period, a program period, and a discharge period of a program cycle; and a page buffer circuit for supplying a first and second voltage to the bit lines in accordance with the data bits to be programmed in the memory cell array during the bit line setup period of the program cycle, wherein the control means biases the string select line to the first voltage during the bit line setup period and to a third voltage between the first and second voltages during the string select line setup and program periods.

22. The device of claim 21, wherein the first voltage is a power supply voltage, and the second voltage is a ground voltage.

23. The device of claim 21, wherein the third voltage is sufficient to turn on the string select transistor connected to the bit line corresponding to the data bit to be programmed.

24. The device of claim 21, wherein the third voltage is between a fourth and fifth voltages, wherein the fourth voltage is sufficient to turn on the first select transistor connected to the bit line corresponding to the data bit to be programmed, and wherein the fifth voltage is a shut-off voltage of the first select transistor for the bit line corresponding to the data bit to be program inhibited, the shut-off voltage being determined by the first voltage—($\beta \times Vpgm$), wherein $\beta$ is a coupling ratio of the word line to the string select line and wherein Vpgm is the program voltage.

25. The device of claim 21, wherein the third voltage is substantially twice a threshold voltage of NMOS transistor.

26. A method of programming in a non-volatile semiconductor memory device having a memory cell array formed of a plurality of cell strings each of which is connected through a first and second select transistor between a bit line and a common source line and each of which includes a plurality of cell transistors, formed in a pocket P-well, control gates of each memory cell transistor being respectively coupled to a word line arranged in parallel between a first and second select line, the method comprising the steps of:

performing a bit line setup operation in which one of first and second voltages, the second voltage being lower than the first voltage, is applied to the bit lines corresponding to the cell strings in accordance with data bits to be programmed; and performing a programming operation in which a program voltage is applied to a selected one of the word lines, wherein the first select line is biased to the first voltage during a first time in the bit line setup operation and is biased to a third voltage between the first voltage and the second voltage during a second time after the bit line set up operation, wherein the third voltage is between a fourth and fifth voltage, wherein the fourth voltage is sufficient to turn on the first select transistor connected to the bit line corresponding to the data bit to be programmed, and the fifth voltage is a shut-off voltage of the first select transistor for the bit line corresponding to the data bit to be program inhibited, the shut-off voltage being determined by the first voltage—($\beta \times Vpgm$), wherein $\beta$ is a coupling ratio of the word line to the string select line, and wherein Vpgm is the program voltage.

27. A method of programming in a non-volatile semiconductor memory device having a memory cell array formed of a plurality of cell strings each of which is connected through a first and second select transistors between a bit line and a common source line and has a plurality of cell transistors, formed in a pocket P-well, having control gates of the memory cell transistor being respectively coupled to a word line arranged in parallel between a first and second select line, method comprising the steps of:

applying one of a first and second voltage, the second voltage being lower than the first voltage, to the bit lines corresponding to the cell strings in accordance with the data bits to be programmed, in such manner that the first select line is biased to the first voltage;

biasing the first select line to a third voltage that is between the first voltage and the second voltage; and applying a program voltage to a selected one of the word lines, in such manner that the first select line is biased to the third voltage, wherein the third voltage is between a fourth and fifth voltage, wherein the fourth voltage is sufficient to turn on the first select transistor connected to the bit line corresponding to the data bit to be programmed, and wherein the fifth voltage is a shut-off voltage of the first select transistor for the bit line corresponding to the data bit to be program inhibited, the shut-off voltage being determined by the first voltage—($\beta \times Vpgm$), wherein $\beta$ is a coupling ratio of the word line to the string select line, and wherein Vpgm is the program voltage.

28. A non-volatile semiconductor memory device comprising:

a memory cell array having a plurality of cell strings formed of a string select transistor having a drain connected to a bit line corresponding thereto, a ground select transistor having a source connected to a common source line, and a plurality of memory cell transistors serially connected between a source of the string select transistor and a drain of the ground select transistor, word lines connected to control gates of the memory cell transistors in the respective cell string, a string select line commonly connected to gates of the string select transistors in the respective cell string, and a ground select line commonly connected to gates of the ground select transistors in the respective cell string;

a means for controlling potentials of the select lines and the word lines in accordance with a bit line setup, string select line setup, a program, and a discharge period of a program cycle; and a page buffer circuit for supplying a first and second voltage to the bit lines in accordance with the data bits to be programmed in the memory cell array during the bit line setup period of the program cycle, wherein the control means biases the string select line to the first voltage during the bit line setup period and to a third voltage between the first and second voltages during the string select line setup and program periods, wherein the third voltage is between a fourth and fifth voltages, wherein the fourth voltage is sufficient to turn on the first select transistor connected to the bit line corresponding to the data bit to be programmed, and wherein the fifth voltage is a shut-off voltage of the first select transistor for the bit line corresponding to the data bit to be program inhibited, the shut-off voltage being determined by the first voltage—($\beta \times $Vpgm), wherein $\beta$ is a coupling ratio of the word line to the string select line and wherein Vpgm is the program voltage.

29. A non-volatile semiconductor memory device comprising:

a memory cell array having a plurality of cell strings formed of a string select transistor having a drain connected to a bit line corresponding thereto, a ground select transistor having a source connected to a common source line, and a plurality of memory cell transistors serially connected between a source of the string select transistor and a drain of the ground select transistor, word lines connected to control gates of the memory cell transistors in the respective cell string, a string select line commonly connected to gates of the string select transistors in the respective cell string, and a ground select line commonly connected to gates of the ground select transistors in the respective cell string;

a means for controlling potentials of the select lines and the word lines in accordance with a bit line setup, string select line setup, a program, and a discharge period of a program cycle; and a page buffer circuit for supplying a first and second voltage to the bit lines in accordance with the data bits to be programmed in the memory cell array during the bit line setup period of the program cycle, wherein the control means biases the string select line to the first voltage during the bit line setup period and to a third voltage between the first and second voltages during the string select line setup and program periods, wherein the third voltage is substantially twice a threshold voltage of a NMOS transistor.

* * * * *